(12) United States Patent
Kim et al.

(10) Patent No.: US 8,242,680 B2
(45) Date of Patent: Aug. 14, 2012

(54) GREEN PHOSPHORS, METHODS OF PREPARING THE GREEN PHOSPHORS, AND WHITE LIGHT-EMITTING DEVICES INCLUDING THE GREEN PHOSPHORS

(75) Inventors: Tae-gon Kim, Seoul (KR); Tae-hyung Kim, Seoul (KR); Seoung-jae Im, Seoul (KR); Seung-joo Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/150,692

(22) Filed: Jun. 1, 2011

(65) Prior Publication Data

US 2012/0068591 A1  Mar. 22, 2012

(30) Foreign Application Priority Data

Sep. 16, 2010 (KR) .................. 10-2010-0091093

(51) Int. Cl.
  *H01J 63/04* (2006.01)
  *H01J 1/63* (2006.01)
  *C09K 11/78* (2006.01)
  *B32B 5/16* (2006.01)

(52) U.S. Cl. .... 313/484; 313/483; 445/23; 252/301.4 R; 252/301.6 R; 428/402

(58) Field of Classification Search ............. 313/484, 313/483; 252/301.4 R, 301.6 R; 428/402; 445/23–25
See application file for complete search history.

(56) References Cited

PUBLICATIONS

Jie Liu, et al., "Eu2+-Doped high-Temperature phase Ca3SiO4Cl2; A Yellowish Orange phosphor for white light-Emitting diodes", Journal of the Electrochemical Society, 152(11) G880-G884 (2005).
I. Baginskiy, et al. "Significant Improved luminescence Intensity of Eu2+-Doped Ca3SiOCl2 Green phosphor for white LEDS synthesized through two-stage method", Journal of the Electrochemical Society, 156 (5) G29-G32 (2009).
Jie Liu, et al., "Characterization and Properties of Green Emitting Ca3SiO4Cl2:Eu2+Powder phosphor for white light emitting diodes", Chemistry Letters vol. 34, No. 10 pp. 1340-1341 (2005).
Weijia Ding, et al., "A novel orange phosphor of Eu2+—activated calcium chlorosilicate for white light-emitting diodes", Journal of Solid State Chemistry 179 (2006) 3582-3585.

*Primary Examiner* — Joseph L Williams
(74) *Attorney, Agent, or Firm* — Cantor Colburn LLP

(57) ABSTRACT

A green phosphor, has an orthorhombic structure of a Pnma space group and the Formula 1:

$$(M^1_{1-x}D_x)_p M^2_q O_r A_s$$ [Formula 1]

wherein $M^1$ is magnesium, calcium, strontium, barium, and any combination thereof, D is at least one of metal selected from the group consisting of europium, manganese, antimony, cerium, praseodymium, neodymium, samarium, terbium, dysprosium, erbium, ytterbium, bismuth, and any combination thereof, $M^2$ is at least one selected from the group consisting of silicon, germanium, aluminum, gallium, and any combination thereof, A is at least one selected from the group consisting of chlorine, fluorine, bromine, iodine, and any combination thereof, and $2.7 \leq p \leq 3.3$, $0.7 \leq q \leq 1.3$, $3.5 \leq r \leq 4.5$, $1.7 \leq s \leq 2.3$, and $0 < x \leq 0.1$. A method of preparing the green phosphor is disclosed, and a white light-emitting device including the green phosphor. The white light-emitting device has good thermal stability.

14 Claims, 10 Drawing Sheets

GREEN PHOSPHORS, METHODS OF PREPARING THE GREEN PHOSPHORS, AND WHITE LIGHT-EMITTING DEVICES INCLUDING THE GREEN PHOSPHORS

CROSS-REFERENCE TO RELATED APPLICATIONS

This application claims priority to Korean Patent Application No. 10-2010-0091093, filed on Sep. 16, 2010, and all the benefits accruing therefrom under 35 U.S.C 119, the content of which in its entirety is herein incorporated by reference.

BACKGROUND

1. Field

The present disclosure relates to green phosphors, methods of preparing the green phosphors, and white light-emitting devices including the green phosphors. More particularly, the present disclosure relates to green phosphors with good thermal stability, methods of preparing the green phosphors, and white light-emitting devices including the green phosphors.

2. Description of the Related Art

Fluorescent lamps and incandescent bulbs are widely used in typical lighting systems. However, mercury (Hg), used in fluorescent lamps, may cause environmental problems when improperly disposed of. Further, typical lighting systems, and particularly incandescent lighting systems, have very short lifetimes (typically less than about 1,000 hours of constant use) and low efficiencies (less than 200 lumens per watt). Thus, their use is undesirable or impractical for applications where reduced power consumption is desired. Correspondingly, much research has been performed to improve such characteristics as lifetime and efficiency, and as a result, the efficiency of white light-emitting devices has been improved.

In white light-emitting devices, white light is generated in various ways, such as for example, by exciting phosphors emitting in each of the three primary colors (red, green, and blue) of emitted light by using a ultraviolet light-emitting diode ("UV LED") as a light source, by exciting red and green phosphors with a blue light emitting diode ("LED") as a light source, and by exciting a yellow phosphor with a blue LED as a light source.

Phosphors used in white light-emitting devices need to efficiently absorb light emitted from an LED used to excite the phosphors, to emit light at high efficiency at a wavelength appropriate for its purpose, and to retain its initial luminance efficiency and light characteristics even at high temperatures. For example, a widely used green phosphor, $(Ba,Sr)_2SiO_4$: $Eu^{2+}$, has high efficiency at room temperature. However, this green phosphor has very low thermal stability and thus, when driving a light-emitting device including this green phosphor at an increased temperature for the light-emitting device, the room-temperature efficiency of the green phosphor decreases rapidly.

The recently developed beta silicon-aluminum oxynitride (β-SiAlON) phosphors, have high efficiency and good thermal stability. However, since the β-SiAlON phosphor is synthesized at a high temperature of about 2,000° C. and at a high pressure of 10 atmospheres (atm; 1.01 megapascals, MPa) by using specialized and expensive production equipment, it is inefficient and difficult to produce the β-SiAlON phosphor in a large scale. Further, while $SrSi_2O_2N_2:Eu^{2+}$ phosphor has high efficiency and good thermal stability, the $SrSi_2O_2N_2$: $Eu^{2+}$ phosphor has an emission peak at a wavelength greater than 540 nm. Thus, the widely available green phosphors such as $SrSi_2O_2N_2:Eu^{2+}$ phosphor may not be appropriate for illumination with good color rendering properties, or as a phosphor with high color reproducibility.

SUMMARY

The above and other deficiencies in the art may be overcome by, in an embodiment, green phosphors with good thermal stability that are readily prepared.

Methods of preparing green phosphors with good thermal stability are also provided.

Further provided are white light-emitting devices with good thermal stability.

Additional aspects will be set forth in part in the description which follows and, in part, will be apparent from the description, or may be learned by practice of the presented embodiments.

According to an embodiment, a green phosphor is represented by Formula 1 below, and in an X-ray diffraction pattern obtained by diffracting the green phosphor with Kα1 of Cu, a first intensity peak is positioned at a diffraction angle (2θ) of 30.5±1.0 and second through sixth intensity peaks are positioned at diffraction angles 24.8±1.0, 32.0±1.0, 35.0±1.0, 39.3±1.0 and 48.5±1.0 degrees, wherein the diffraction angle order does not match the second through sixth intensity peak order:

[Formula 1]

wherein $M^1$ is at least one of metal selected from the group consisting of magnesium (Mg), calcium (Ca), strontium (Sr), barium (Ba), and any combination thereof, D is at least one of metal selected from the group consisting of europium (Eu), manganese (Mn), antimony (Sb), cerium (Ce), praseodymium (Pr), neodymium (Nd), samarium (Sm), terbium (Tb), dysprosium (Dy), erbium (Er), ytterbium (Yb), bismuth (Bi), and any combination thereof, $M^2$ is at least one selected from the group consisting of silicon (Si), germanium (Ge), aluminum (Al), gallium (Ga), and any combination thereof, A is at least one selected from the group consisting of chlorine (Cl), fluorine (F), bromine (Br), iodine (I), and any combination thereof, and $2.7 \leq p \leq 3.3$, $0.7 \leq q \leq 1.3$, $3.5 \leq r \leq 4.5$, $1.7 \leq s \leq 2.3$, and $0 < x \leq 0.1$.

The green phosphor has an orthorhombic structure of a Pnma space group, wherein the green phosphor has a lattice constant a, b, and c wherein $10.5 \leq a \leq 12.2$, $9.5 \leq b \leq 11$, and $4.8 \leq c \leq 6.2$ (unit: Å), and in a unit lattice, each of $M^1$ and D of Formula 1 is present at coordinates x, y, and z, respectively, of (0.33±0.1, 0.08±0.1, 0.36±0.1) and (0.04±0.1, 0.25±0.1, 0.62±0.1), $M^2$ is present at a coordinate x, y, and z, respectively, of (0.28±0.1, 0.25±0.1, 0.81±0.1), O is present at coordinates x, y, and z, respectively, of (0.33±0.1, 0.25±0.1, 0.08±0.1), (0.21±0.1, 0.12±0.1, 0.73±0.1), and (0.38±0.1, 0.25±0.1, 0.62±0.1), and A is present at a coordinate x, y, and z, respectively, of (0.07±0.1, 0.07±0.1, 0.25±0.1).

According to another embodiment, a method of preparing a green phosphor includes: mixing an oxide of at least one of metal selected from the group consisting of Mg, Ca, Sr, Ba, and any combination thereof; an oxide of at least one of metal selected from the group consisting of Si, Ge, Al, Ga, and any combination thereof, and an oxide of at least one of metal selected from the group consisting of Eu Mn, Sb, Ce, Pr, Nd, Sm, Tb, Dy, Ho, Er, Yb, Bi, and any combination thereof; heat treating the mixture at a temperature of about 900 to about 1,500° C. in air; mixing the heat treatment product and a halogenated material of Ca, Sr, Ba, or a combination comprising at least one of these; sintering the resultant mixture under a reducing atmosphere at a temperature of about 1,080 to about 1,200° C.; and grinding the sintered product.

According to another embodiment, a light-emitting device includes: a light-emitting diode (LED); and the green phosphor described above.

The light-emitting diode is a blue or ultraviolet (UV) LED.

In a luminescence spectrum of the green phosphor, a peak emission wavelength is about 490 nm to about 560 nm.

The light-emitting device may further include at least one of phosphor selected from the group consisting of a blue phosphor and a red phosphor.

The light-emitting device may be used for a traffic light, a light source of a communication device, a backlight of a display device, or illumination.

A white light emitting device includes an ultraviolet or blue light-emitting diode (LED); and a combination of a red phosphor, a green phosphor represented by Formula 1 below, and optionally, a blue phosphor, wherein in an X-ray diffraction pattern obtained by diffracting the green phosphor with Kα1 of Cu, a first intensity peak is positioned at a diffraction angle (2θ) of 30.5±1.0 and second through sixth intensity peaks are positioned at diffraction angles 24.8±1.0, 32.0±1.0, 35.0±1.0, 39.3±1.0 and 48.5±1.0 degrees, wherein the diffraction angle order does not match the second through sixth intensity peak order:

[Formula 1]

wherein $M^1$ is at least one of metal selected from the group consisting of magnesium, calcium, strontium, barium, and any combination thereof, D is at least one of metal selected from the group consisting of europium, manganese, antimony, cerium, praseodymium, neodymium, samarium, terbium, dysprosium, erbium, ytterbium, bismuth, and any combination thereof, $M^2$ is at least one selected from the group consisting of silicon, germanium, aluminum, gallium, and any combination thereof, A is at least one selected from the group consisting of chlorine, fluorine, bromine, iodine, and any combination thereof, and $2.7 \leq p \leq 3.3$, $0.7 \leq q \leq 1.3$, $3.5 \leq r \leq 4.5$, $1.7 \leq s \leq 2.3$, and $0 < x \leq 0.1$.

BRIEF DESCRIPTION OF THE DRAWINGS

The above and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In the figures, like reference numerals refer to like elements, and the size or thickness of respective elements may be exaggerated for the clarity of description.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof. All ranges and endpoints reciting the same feature are independently combinable.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, green phosphors according to embodiments of the present invention, methods of preparing the green phosphors, and white light-emitting devices including the green phosphors will be described in detail.

A green phosphor according to an embodiment is represented by Formula 1 below, and in an X-ray diffraction pattern obtained by diffracting the green phosphor with Kα1 of Cu, a first intensity peak is positioned at a diffraction angle (2θ) of 30.5±1.0 and second through sixth intensity peaks are positioned at diffraction angles 24.8±1.0, 32.0±1.0, 35.0±1.0, 39.3±1.0 and 48.5±1.0 degrees, in which the diffraction angle order may not match the second through sixth intensity peak order:

$$(M^1_{1-x}D_x)_p M^2_q O_r A_s \quad \text{[Formula 1]}$$

wherein $M^1$ is at least one of metal selected from the group consisting of magnesium (Mg), calcium (Ca), strontium (Sr), barium (Ba), and any combination thereof, D is at least one of metal selected from the group consisting of europium (Eu), manganese (Mn), antimony (Sb), cerium (Ce), praseodymium (Pr), neodymium (Nd), samarium (Sm), terbium (Tb), dysprosium (Dy), erbium (Er), ytterbium (Yb), bismuth (Bi), and any combination thereof, $M^2$ is at least one of metal or semimetal selected from the group consisting of silicon (Si), germanium (Ge), aluminum (Al), gallium (Ga), and any combination thereof, A is at least one halogen selected from the group consisting of chlorine (Cl), fluorine (F), bromine (Br), iodine (I), and any combination thereof, and $2.7 \leq p \leq 3.3$, $0.7 \leq q \leq 1.3$, $3.5 \leq r \leq 4.5$, $1.7 \leq s \leq 2.3$, and $0 < x \leq 0.1$.

The green phosphor absorbs light with a wavelength of about 300 nm to about 480 nm and emits visible light with a peak wavelength of about 490 nm to about 560 nm. Accordingly, the green phosphor is a material from which green light can be obtained.

The green phosphor of Formula 1 has an orthorhombic structure of a Pnma space group having a lattice constants a, b, and c, where $10.5 \leq a \leq 12.2$, $9.5 \leq b \leq 11$, and $4.8 \leq c \leq 6.2$ (unit: Å), and in a unit lattice, each of $M^1$ and D of Formula 1 is present at coordinates x, y, and z, respectively, of (0.33±0.1, 0.08±0.1, 0.36±0.1) and (0.04±0.1, 0.25±0.1, 0.62±0.1), $M^2$ is present at a coordinate x, y, and z, respectively, of (0.28±0.1, 0.25±0.1, 0.81±0.1), O is present at coordinates x, y, and z, respectively, of (0.33±0.1, 0.25±0.1, 0.08±0.1), (0.21±0.1, 0.12±0.1, 0.73±0.1), and (0.38±0.1, 0.25±0.1, 0.62±0.1), and A is present at a coordinate x, y, and z, respectively, of (0.07±0.1, 0.07±0.1, 0.25±0.1).

The green phosphor according to the present embodiment, for example, $Ca_3SiO_4Cl_2$ may have the same chemical composition as a conventionally known material. However, the crystal structure of the green phosphor is completely different from that of a conventionally known material having the same crystal chemical composition. Accordingly, the green phosphor according to the present embodiment is a novel material based on its structure. That is, as described above, when the green phosphor according to the present embodiment is compared to a conventionally known material, they have completely different major-peak locations in an X-ray diffraction spectrum, different crystal structures, for example, an orthorhombic system for the green phosphor according to the present embodiment and a monoclinic system for a conventionally known material having the same chemical composition, and completely different constituent-element locations in a unit cell.

A method of preparing the green phosphor of Formula 1 according to another embodiment includes:

mixing an oxide of at least one of metal selected from the group consisting of Mg, Ca, Sr, Ba, and any combination thereof; an oxide of at least one metal or semimetal selected from the group consisting of Si, Ge, Al, Ga, and any combination thereof, and an oxide of at least one metal selected from the group consisting of Eu Mn, Sb, Ce, Pr, Nd, Sm, Tb, Dy, Ho, Er, Yb, Bi, and any combination thereof;

heat treating the mixture at a temperature of about 900 to about 1500° C. in air;

mixing the heat treatment product and a halogenated material of Ca, Sr, Ba, or a combination comprising at least one of the foregoing;

sintering the resultant mixture under a reducing atmosphere at a temperature of about 1080 to about 1200° C.; and grinding the sintering product.

In the method, reactants are represented as oxides. It will be understood that any suitable salt may be used, where such salts including, for example, a carbonate, a nitrate, an oxalate, or an acetate, are oxidized during high-temperature synthesis and ultimately, form the oxide. Accordingly, a starting material may also be, in addition to an oxide of metal for example, a carbonate, a nitrate, an oxalate, or an acetate of the metal, as long as a mole ratio of the metals is within the ranges described above.

In the method, a reducing atmosphere may include a mixed gas including hydrogen and nitrogen, in which the amount of hydrogen in the mixed gas is at least 5 volume %. Such gas mixtures are also referred to in the art as "forming gas".

The Eu oxide alone, or a mixture of the Eu oxide and an oxide of at least one metal selected from the group consisting of Mn, Sb, Ce, Pr, Nd, Sm, Tb, Dy, Ho, Er, Yb, Bi, and any combination thereof, may be doped as an ion in a phosphor crystal during heat treatment, and thus, when the green phosphor emits light, the Eu oxide and the mixture act as an activator.

The sintering process includes the heat treating in air and then sintering under a reducing atmosphere. By performing the heat treating, crystal growth is promoted while removing impurities, such as water molecules, organic materials, or a complex compound of a salt, contained in the mixture. If the temperature of the heat treating is less than 900° C., crystal may not form; and if the temperature of the heat treating is higher than 1500° C., the mixture may evaporate, thereby changing the stoichiometric ratio, or the mixture may melt and a glass phase may be generated and thus, the final phosphor crystallinity may be degraded and the wavelength conversion efficiency of the green phosphor may be decreased. In this regard, by setting the sintering temperature in a range of about 1080° C. to about 1200° C., an orthorhombic crystal structure may be obtained.

The obtained sintering product is ground into powder and washed with distilled water, thereby producing a green phosphor.

A light-emitting device according to an embodiment includes a light-emitting diode (LED), and the green phosphor.

In the white light-emitting device, the LED may be a blue or ultra violet (UV) LED, and a peak wavelength range of an excitation light source may be about 300 to about 480 nm.

In the light-emitting device, in a luminescence (emission) spectrum of the green phosphor, a peak wavelength may be in a range of about 490 to about 560 nm.

The light-emitting device may further include at least one phosphor selected from the group consisting of a blue phosphor, a red phosphor, and a combination thereof.

Examples of a blue phosphor include $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $BaMgAl_{10}O_{17}:Eu^{2+}$ and $Sr_2Si_3O_8(2SrCl_2):Eu^{2+}$; $Ba_3MgSi_2O_8:Eu^{2+}$; and $(Sr,Ca)_{10}(PO_4)_6(nB_2O_3):Eu^{2+}$, and at least one of these may be used in combination in the light-emitting device.

A red phosphor included in the light-emitting device may include at least one material selected from the group consisting of $(Ba,Sr,Ca)_2Si_5N_8:Eu^{2+}$; $(Sr,Ca)AlSiN_3:Eu^{2+}$; $Y_2O_3:Eu^{3+},Bi^{3+}$; $(Ca,Sr)S:Eu^{2+}$; $CaLa_2S_4:Ce^{3+}$; $(Sr,Ca,Ba)_2P_2O_7:Eu^{2+},Mn^{2+}$; $(Ca,Sr)_{10}(PO_4)_6(F,Cl):Eu^{2+},Mn^{2+}$; $(Y,Lu)_2WO_6:Eu^{3+},Mo^{6+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)BO_3:Eu^{3+},Bi^{3+}$; $(Gd,Y,Lu,La)(P,V)O_4:Eu^{3+},Bi^{3+}$; $(Ba,Sr,Ca)MgP_2O_7:Eu^{2+},Mn^{2+}$, and any combination thereof.

It will be understood that a white light emitting device includes not only the green phosphor but a red phosphor and a blue phosphor, where a UV or blue LED source is used; or a white light emitting device may include only a red phosphor and the green phosphor where a blue LED source is used. In this way, a white light emitting device includes a UV or blue light-emitting diode (LED); and a combination of a red phosphor, a green phosphor represented by Formula 1, and optionally, a blue phosphor.

Figure 1:
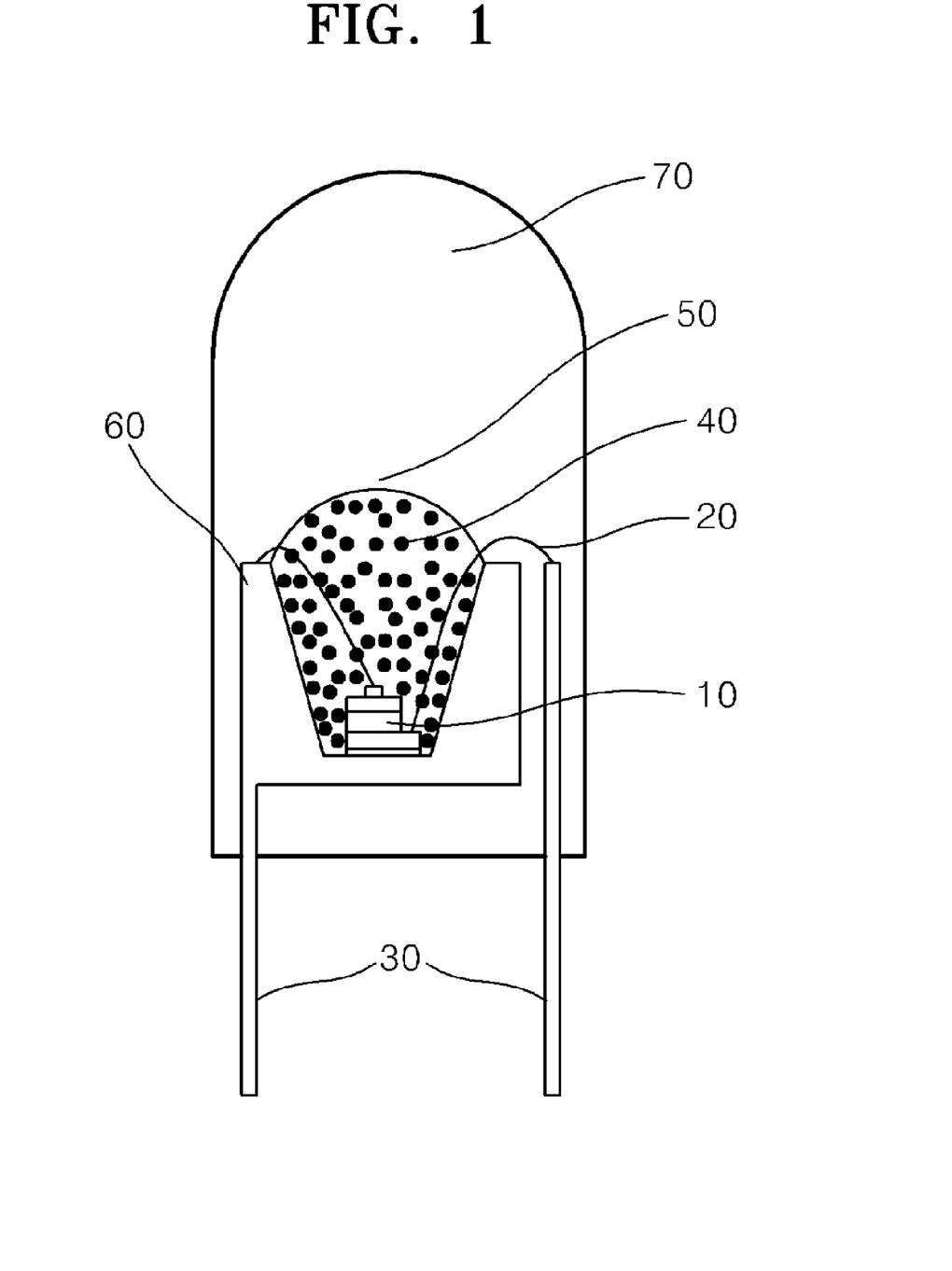
FIG. 1 is a schematic view of a white light-emitting device according to an embodiment.

FIG. 1 is a schematic view of a light-emitting device according to an embodiment. The light-emitting device of FIG. 1 is a polymer lens-type surface mounted light-emitting device. An example of the polymer lens includes an epoxy lens or other thermosetting or thermoplastic material with suitable transparency and low haze.

Referring to FIG. 1, a UV LED chip 10 is die-bonded to an electric lead wire 30 through a gold wire 20, and an epoxy mold layer 50 is formed to include a phosphor composition 40 containing a halosilicate phosphor according to an embodiment. In FIG. 1, a reflective film, which is formed of aluminum or silver, is formed on inner surfaces of a shaped mold 60, and reflects light emitted from a diode upwards and confines an appropriate amount of epoxy.

An epoxy dome lens 70 is formed above the epoxy mold layer 50, and the shape of the epoxy dome lens 70 may differ according to an orientation angle.

The white light-emitting device according to an embodiment is not limited to the structure of FIG. 1. For example, a phosphor may be mounted on the white light-emitting device, or a shell-type or a printed circuit board ("PCB")-type surface mount-type white light-emitting device may also be used.

The white light-emitting device may be used for a traffic light, a light source of a communication device, a backlight of a display device, or illumination.

Instead of being used in the white light-emitting device described above, a green phosphor according to an embodiment may also be used in various lamps, such as a mercury lamp or a xenon lamp, and in a self-emission type liquid crystal display device.

One or more embodiments will now be described in further detail with reference to the following examples. These examples are for illustrative purposes only and are not intended to limit the scope of the one or more embodiments.

Examples 1 through 6

Preparation of Orthorhombic—$Ca_3SiO_4Cl_2:xEu^{2+}$ (Hereinafter Referred to as "o-$Ca_3SiO_4Cl_2:xEu^{2+}$") (x=0.00033 (Ex. 1), 0.00066 (Ex. 2), 0.0013 (Ex. 3), 0.0033 (Ex. 4), 0.0066 (Ex. 5), 0.0133 (Ex. 6)) Phosphors As starting materials, 2.00 g of $CaCO_3$, 1.2 g of $SiO_2$, and either 0.0035 g (Example 1), 0.007 g (Example 2), 0.014 g (Example 3), 0.035 g (Example 4), 0.07 g (Example 5), or 0.14 g (Example 6) of $Eu_2O_3$ were mixed using a mortar and pestle for 30 minutes. The mixed powder was placed into an alumina reaction vessel and heat treated in air at a temperature of 1,300° C. for 5 hours, thereby producing $Ca_2SiO_4:xEu^{2+}$ (x=0.0005 (Ex. 1), 0.001 (Ex. 2), 0.002 (Ex. 3, 0.005 (Ex. 4), 0.01 (Ex. 5), or 0.02 (Ex. 6)). 2.32 g of the $Ca_2SiO_4:xEu^{2+}$ and 2.16 g of $CaCl_2.2H_2O$ were mixed using a mortar and pestle for 30 minutes, sintered in a mixed gas atmosphere including $H_2$ and $N_2$ in a ratio of 5:95 (v/v) at atmospheric pressure at a temperature of 1,100° C. for 8 hours, and slowly cooled. Then, each of the samples was ground in a mortar and then the powder so obtained was washed with distilled water at room temperature to remove residual $CaCl_2$, thereby yielding the orthorhombic $Ca_3SiO_4Cl_2:xEu^{2+}$ (x=0.00033 (Example 1), 0.00066 (Example 2), 0.0013 (Example 3), 0.0033 (Example 4), 0.0066 (Example 5), 0.0133 (Example 6)) phosphors.

Comparative Example 1

Preparation of m(I)-$Ca_3SiO_4Cl_2:Eu^{2+}$ Phosphor

As starting materials, 2.00 g of $CaCO_3$, 1.2 g of $SiO_2$, and 0.14 g of $Eu_2O_3$ were mixed using a mortar and pestle for 30 minutes. The mixed powder was put into an alumina reaction vessel, sintered in a mixed gas atmosphere including $H_2$ and $N_2$ at a ratio of 5:95 (v/v) at atmospheric pressure, at a temperature of 900° C. for 8 hours, and slowly cooled. Then, the sample was ground in a mortar and then the powder so obtained was washed with distilled water at room temperature to remove residual $CaCl_2$, thereby providing a monoclinic m(I)-$Ca_3SiO_4Cl_2:0.0133Eu^{2+}$ phosphor.

Comparative Example 2

Preparation of m(II)-$Ca_3SiO_4Cl_2:Eu^{2+}$ Phosphor

A phosphor was prepared in the same manner as in Comparative Example 1, except that the sintering in a mixed gas atmosphere including $H_2$ and $N_2$ at a ratio of 5:95 (v/v) at atmospheric pressure was performed at a temperature of 1,050° C. instead of 900° C.

Comparative Example 3

Preparation of β-SiAlON:$Eu^{2+}$Phosphor 3.00 g of $Si_3N_4$, 0.09 g of AlN, and 0.03 g of $Eu_2O_3$ were mixed using a mortar and pestle for 30 minutes. The mixed powder was put into a boron nitride (BN) reaction vessel, sintered in a $N_2$ atmosphere at a temperature of 2,000° C. and at 10 atm (1.01 MPa) for 5 hours, and slowly cooled. Then, the sample was ground using a mortar and pestle to produce a β-SiAlON:Eu$^{2+}$ phosphor as a powder.

Comparative Example 4

Preparation of (Sr, Ba)$_2$SiO$_4$:Eu$^{2+}$ Phosphor 2.46 g of SrCO$_3$, 3.22 g of BaCO$_3$, 1 g of SiO$_2$, and 0.12 g of Eu$_2$O$_3$ were mixed using a mortar and pestle for 30 minutes. The mixed powder was put into an alumina reaction vessel, sintered in a mixed gas atmosphere including H$_2$ and N$_2$ at a ratio of 5:95 (v/v) at atmospheric pressure, and at a temperature of 900° C. for 8 hours, and slowly cooled. Then, the sample was ground using a mortar and pestle to produce a β-SiAlON:Eu$^{2+}$ phosphor as a powder.

Figure 2:
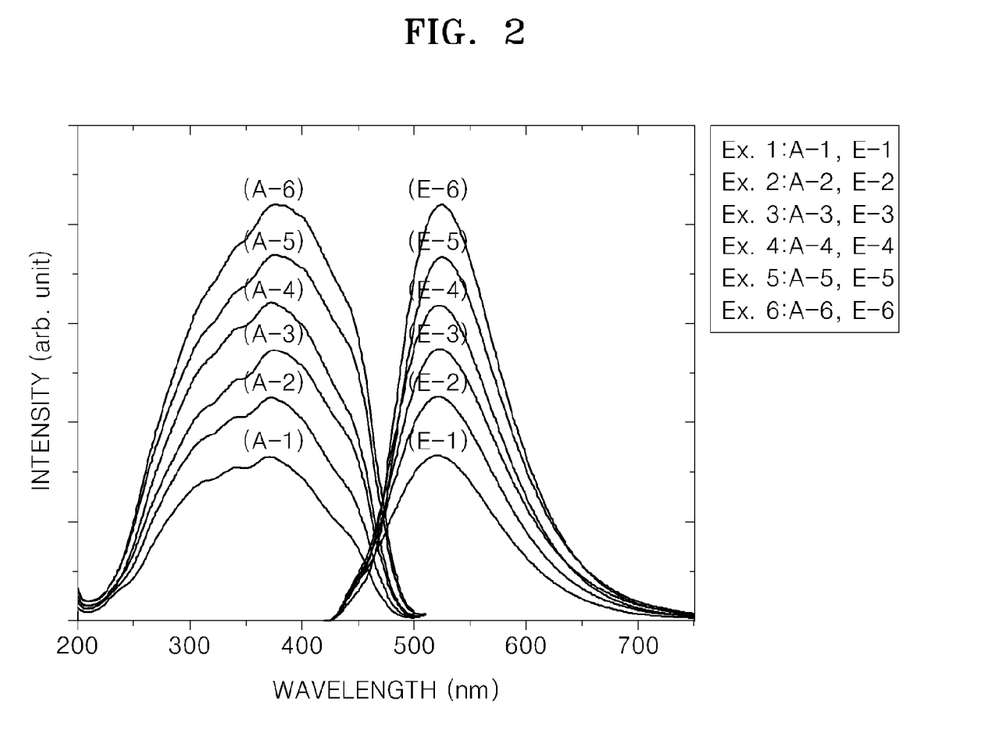
FIG. 2 shows luminescence spectra obtained for green phosphors prepared according to Examples 1 through 6 with an absorbance maximum at a wavelength of 380 nm, and emission spectra showing that these phosphors have an emission maximum at a wavelength of 525 nm.

FIG. 2 shows luminescence spectra as a plot of intensity (arbitrary units) versus wavelength (nm) of the green phosphors prepared according to Examples 1 through 6. Referring to FIG. 2, the green phosphors absorb light with a wavelength in the UV of about 300 nm into the blue region at about 480 nm (absorbance spectra A-1 to A-6, corresponding to Examples 1 to 6, respectively) and emit light with a maximum intensity at a wavelength of about 525 nm (emission spectra E-1 to E-6, corresponding to Examples 1 to 6, respectively). Thus the green phosphors of Examples 1 through 6 are suitable for use as a green phosphor with either or both of a UV and/or blue LEDs as excitation light sources.

Figure 3:
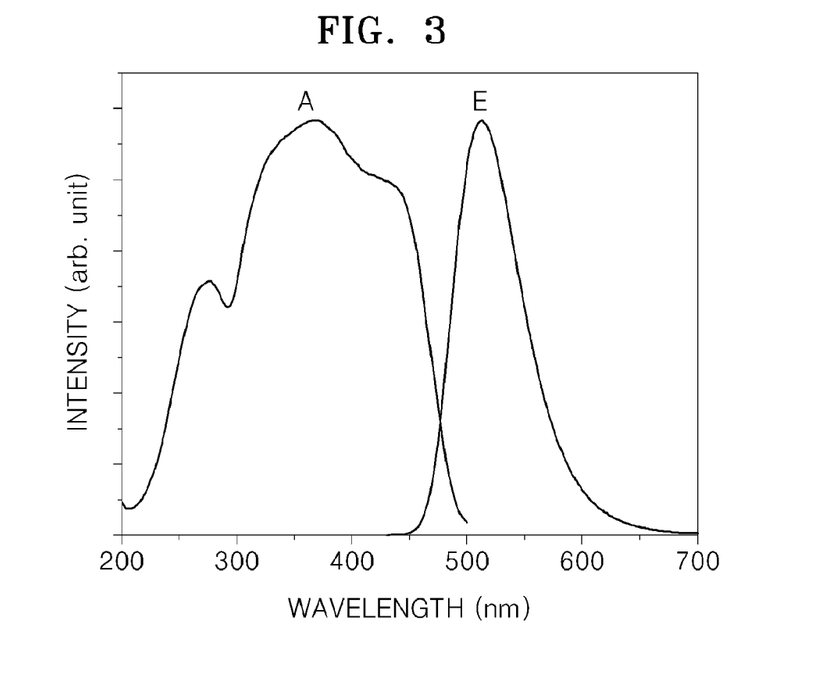
FIG. 3 shows a luminescence spectrum obtained for a green phosphor prepared according to Comparative Example 1 with a maximum absorbance at a wavelength of 370 nm and an emission spectrum for the phosphor showing an emission maximum at a wavelength of 510 nm.

FIG. 3 shows luminescence spectra as a plot of intensity (arbitrary units) versus wavelength (nm) obtained for the green phosphor prepared according to Comparative Example 1. The absorbance spectrum (A in FIG. 3) shows that the phosphor has a maximum absorbance, and is excited, at a wavelength of maximum absorbance of 370 nm, and the emission spectrum (E in FIG. 3) shows that the phosphor emits light with a maximum emission intensity at a wavelength of 510 nm.

Figure 4:
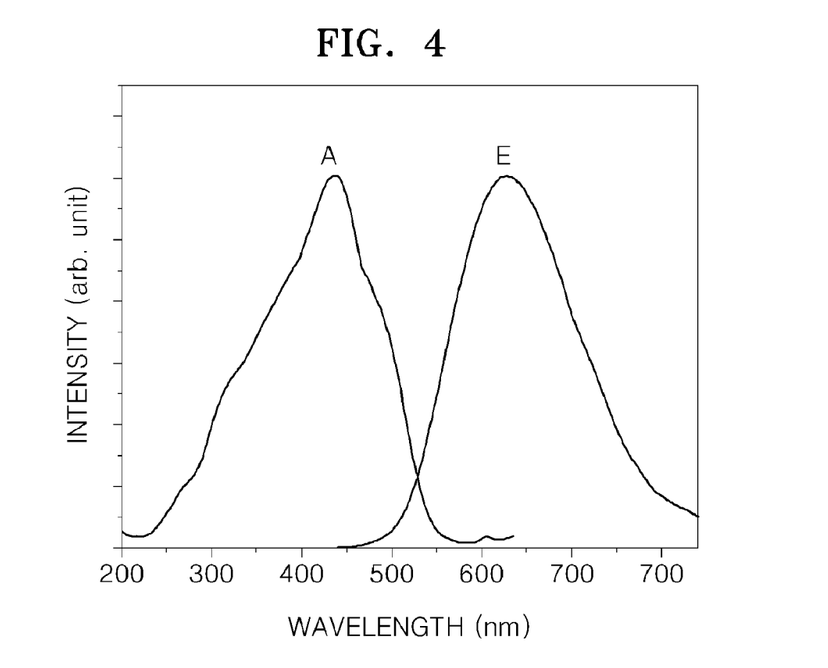
FIG. 4 shows a luminescence spectrum obtained for an orange phosphor prepared according to Comparative Example 2 with a maximum absorbance at a wavelength of 435 nm and an emission spectrum for the orange phosphor showing an emission maximum at a wavelength of 615 nm.

FIG. 4 shows luminescence spectra as a plot of intensity (arbitrary units) versus wavelength (nm) obtained when the phosphor prepared according to Comparative Example 2. The absorbance spectrum (A in FIG. 4) shows that the phosphor has a maximum absorbance, and is excited, at a wavelength of maximum absorbance of 435 nm, and the emission spectrum (E in FIG. 4) shows that the orange phosphor emits light with a maximum emission intensity at a wavelength of 615 nm. Comparing FIG. 2 with FIGS. 3 and 4, it can be seen that although the phosphors of Examples 1 through 6 have the same compositions as the phosphors of Comparative Examples 1 and 2, due to the different crystal structures, the phosphors of Examples 1 through 6 exhibit different absorption and emission characteristics when compared to the phosphors of Comparative Examples 1 and 2.

Figure 5:
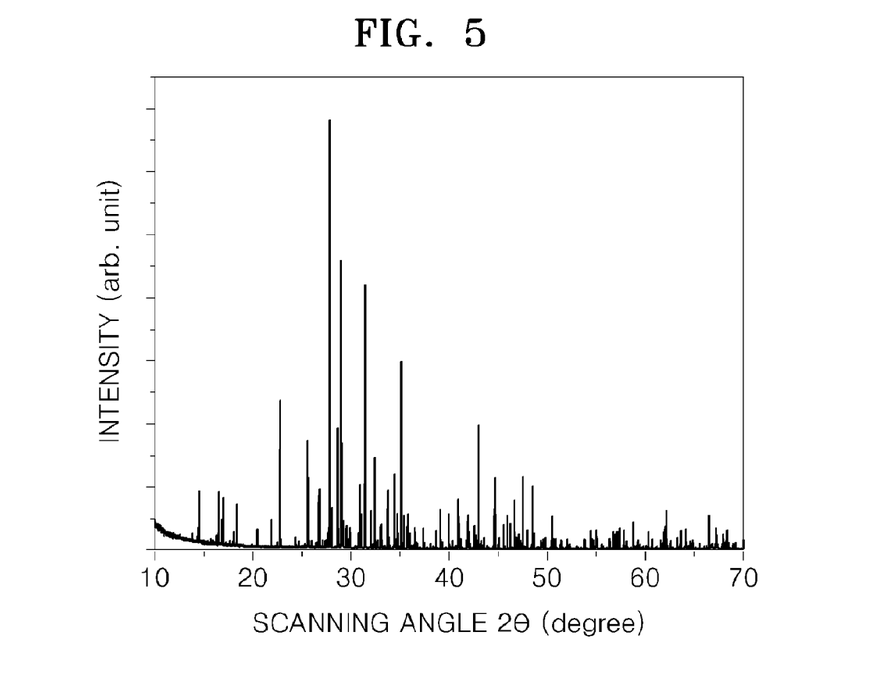
FIG. 5 is an x-ray diffraction ("XRD") spectrum of a green phosphor prepared according to Example 6.

FIG. 5 is an x-ray diffraction (XRD) spectral plot of intensity (arbitrary units) versus scanning angle (2θ, in degrees) for the green phosphor prepared according to Example 6. Referring to FIG. 5, a first intensity peak is present at 30.77°, and second through sixth intensity peaks are present at 32.185°, 35.01°, 39.32°, 24.90°, and 48.46°, respectively.

Figure 6:
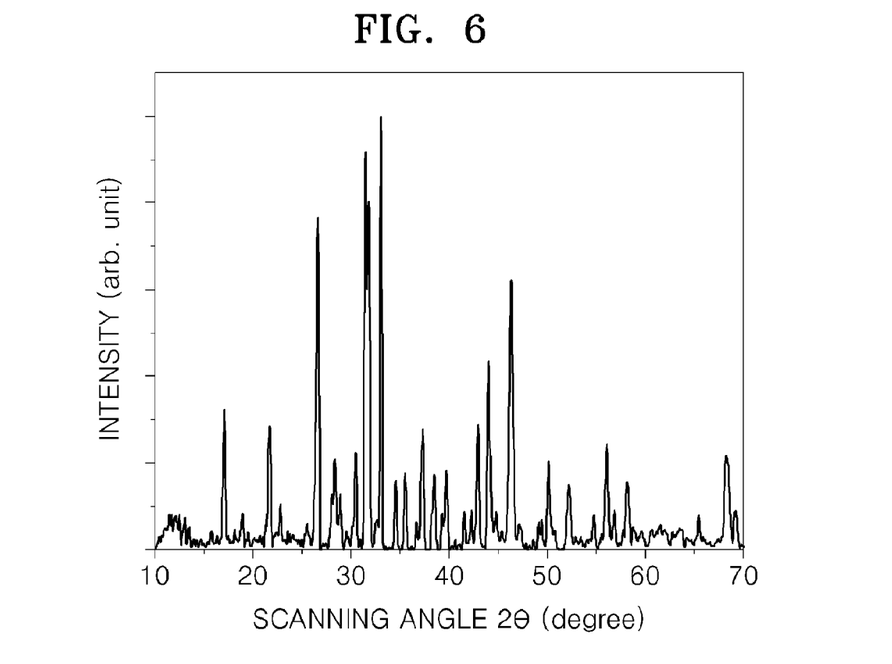
FIG. 6 is an XRD spectrum of a green phosphor prepared according to Comparative Example 1.
Figure 7:
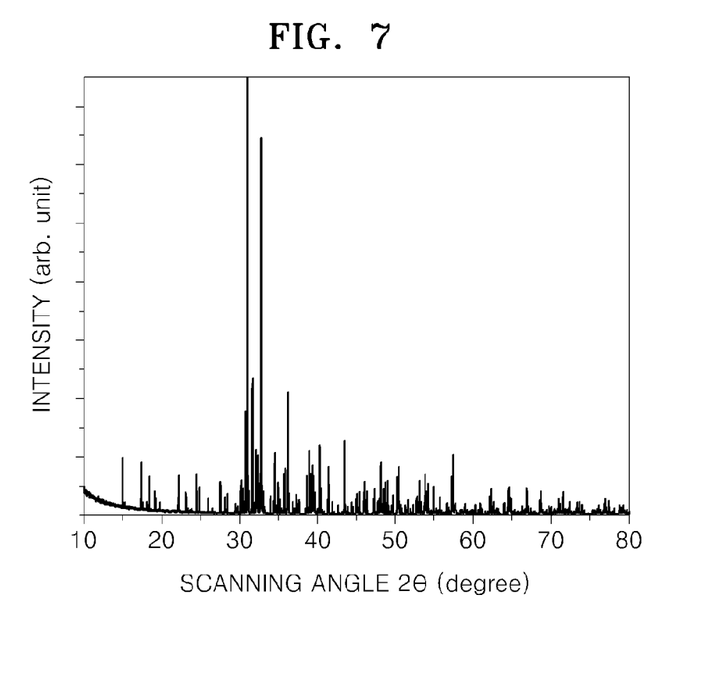
FIG. 7 is an XRD spectrum of an orange phosphor prepared according to Comparative Example 2.
Figure 8:
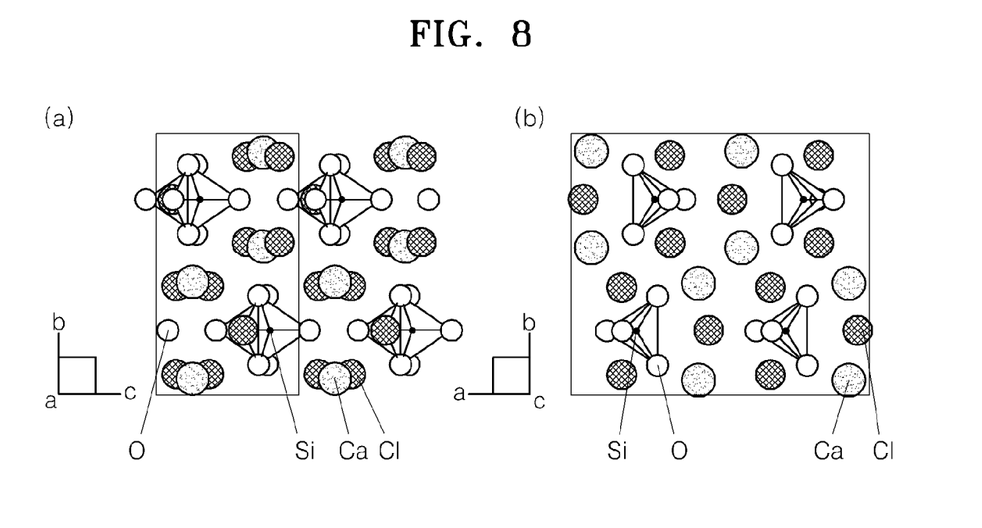
FIGS. 8a and 8b are respectively an a-axis projection view and a c-axis projection view of a crystal structure of a green phosphor prepared according to Example 6.

FIGS. 6 and 7 each show XRD spectral plots of intensity (arbitrary units) versus scanning angle (2θ, in degrees) for the phosphors of Comparative Examples 1 and 2 (respectively), obtained by diffraction of the phosphors with the Kα1 x-ray band of Cu. The phosphors of Example 1 and Comparative Examples 1 and 2 have a common chemical composition of a phosphor host as Ca$_3$SiO$_4$Cl$_2$. However, as seen by comparing the XRD spectrum of FIG. 5 with the XRD spectra of FIGS. 6 and 7, the phosphor of Example 6 has a completely different crystal structure compared to the phosphors of Comparative Examples 1 and 2. Since the phosphor according to an embodiment has a novel crystal structure which has not been reported to the Joint Committee on Powder Diffraction Standards ("JCPDS"), the detailed crystal structure of the phosphor according to an embodiment was confirmed by analyzing results obtained by Synchrotron XRD according to the Rietveld method. The identified crystal structure is shown in FIG. 8. FIG. 8*a* is an a-axis projection view, and FIG. 8*b* is a c-axis projection view. Referring to FIG. 8, this material has an orthorhombic Pnma space group and a lattice constant of a=11.620 Å, b=10.287 Å, and c=5.5736 Å, and a unit cell having two different Ca sites.

Figure 9:
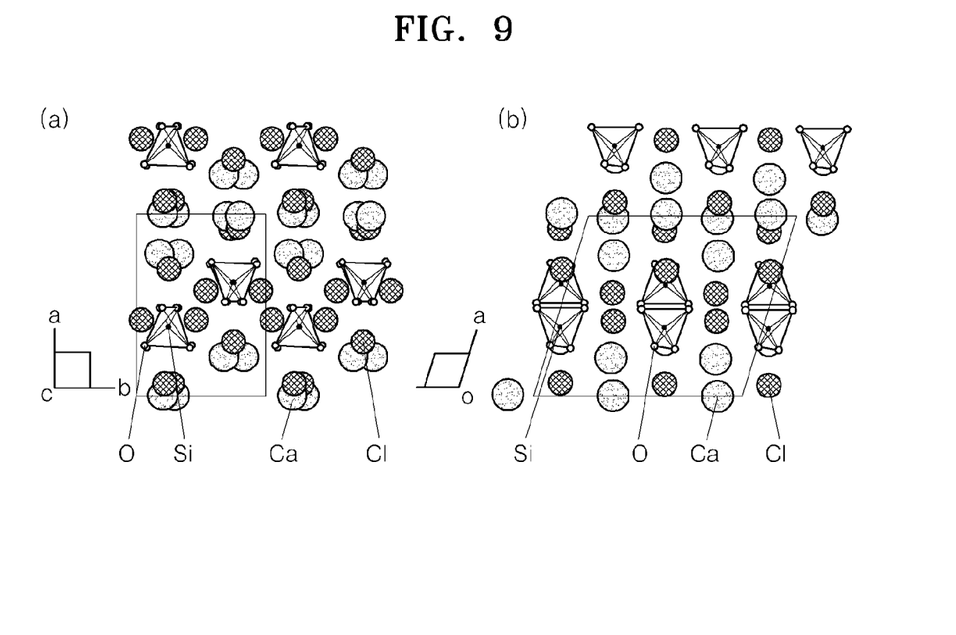
FIGS. 9a and 9b are respectively a c-axis projection view and a b-axis projection view of a crystal structure of a green phosphor prepared according to Comparative Example 1.
Figure 10:
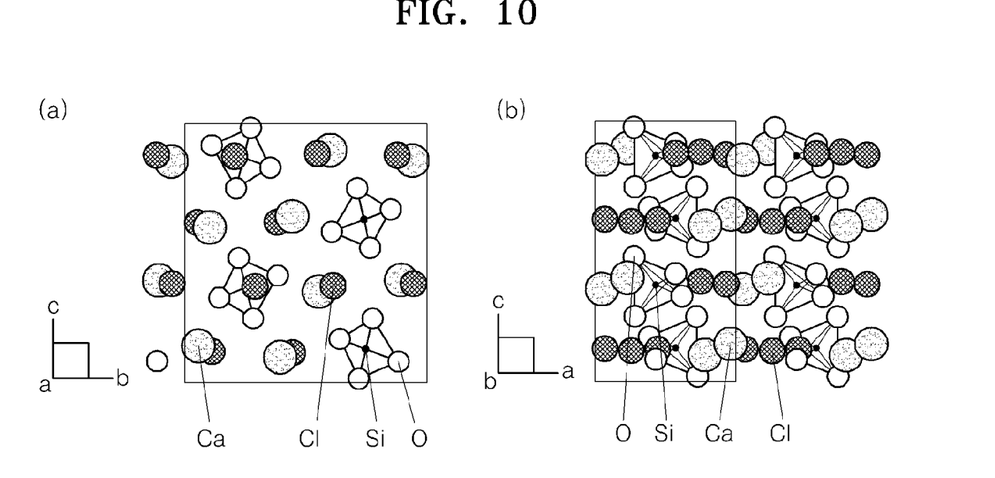
FIGS. 10a and 10b are respectively an a-axis projection view and a b-axis projection view of a crystal structure of an orange phosphor prepared according to Comparative Example 2.

FIGS. 9 and 10 show crystal structures of the phosphors of Comparative Examples 1 and 2 obtained by analyzing Sychrotron XRD results according to a Rietveld method. FIG. 9*a* is a c-axis projection view and FIG. 9*b* is a b-axis projection view. FIG. 10*a* is an a-axis projection view and FIG. 10*b* is a b-axis projection view. The crystal structure of the phosphor of Comparative Example 1 is known, and has a monoclinic P21/c space group, a lattice constant of a=9.7820 Å, b=6.7380 Å, c=10.799 Å, and β=106.0 degrees, and a unit cell having three different sites for Ca. Since the crystal structure of the phosphor of Comparative Example 2 is not known, the crystal structure of the phosphor of Comparative Example 2 was determined as discussed herein. The phosphor of Comparative Example 2 was found to have the same monoclinic space group as the phosphor of Comparative Example 1. However, in comparison with the phosphor of Comparative Example 1, the phosphor of Comparative Example 2 has different atomic sites and a different lattice constant of a=5.9125 Å, b=10.201 Å, c=10.989 Å, and β=90.34 degrees and a unit cell having three different sites for Ca.

The green phosphors of Examples 1 through 6 were heated to a temperature of 200° C. and luminescence characteristics thereof were analyzed.

In comparison to the analysis of the green phosphors of Examples 1 through 6, the same experiment was performed using m(I)-Ca$_3$SiO$_4$Cl$_2$:Eu$^{2+}$ phosphor of Comparative Example 1, and m(II)-Ca$_3$SiO$_4$Cl$_2$:Eu$^{2+}$ phosphor of Comparative Example 2 and β-SiAlON:Eu$^{2+}$ phosphor of Comparative Example 3, which is known as a traditional green phosphor, and (Sr, Ba)$_2$SiO$_4$: Eu$^{2+}$ phosphor of Comparative Example 4.

Figure 11:
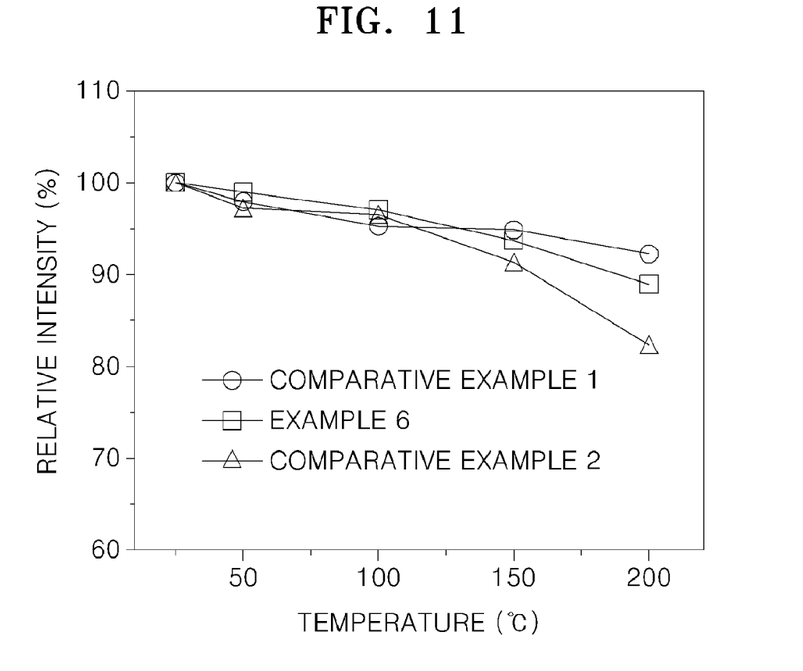
FIG. 11 is a plot of relative luminescence intensity with respect to a temperature of phosphors prepared according to Example 6 and Comparative Examples 1 and 2.
Figure 12:
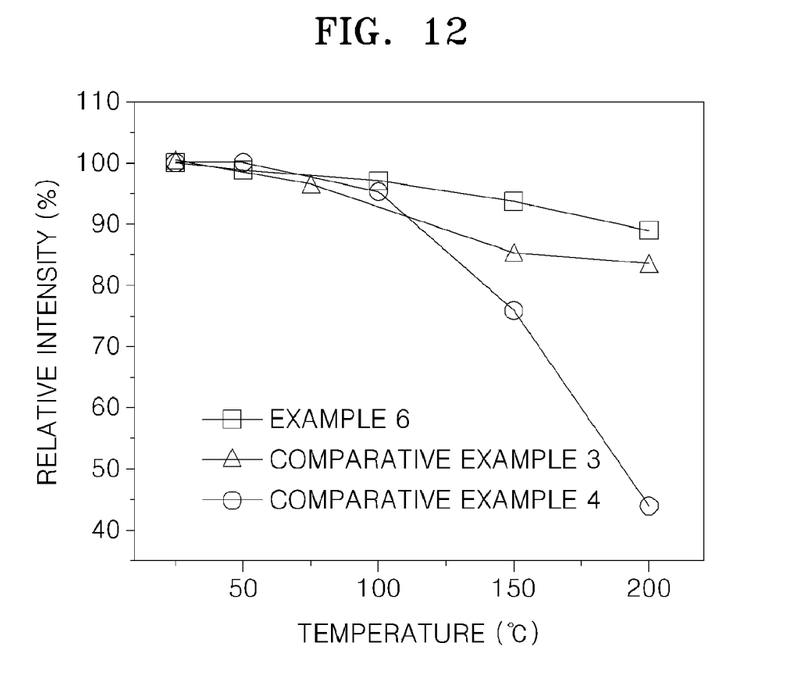
FIG. 12 is a plot of relative luminescence intensity with respect to a temperature of green phosphors prepared according to Example 6 and Comparative Examples 3 and 4.

FIGS. 11 and 12 are each plots of relative emission intensity (%) versus temperature (° C.), which show the thermal characteristics of different examples and comparative examples. FIG. 11 shows the relative thermal characteristics of the phosphor of Example 6 and the phosphors of Comparative Examples 1 and 2. Referring to FIG. 11, m(I)-Ca$_3$SiO$_4$Cl$_2$:Eu$^{2+}$ (Comparative Example 1), o-Ca$_3$SiO$_4$Cl$_2$:Eu$^{2+}$ (Example 6), and m(II)-Ca$_3$SiO$_4$Cl$_2$:Eu$^{2+}$ (Comparative Example 2) have good efficiency retention characteristics of 92%, 89%, and 82%, respectively, relative to initial brightness at a temperature of 200° C., respectively. Referring to FIG. 12, brightness of (Sr,Ba)$_2$SiO$_4$:Eu$^{2+}$ phosphor (Comparative Example 4) is substantially reduced to 40% of its initial brightness at a temperature of 200° C., and brightness of the phosphor of Example 6 is reduced slightly to 89% of an initial brightness at a temperature of 200° C. Thus, the phosphor of Example 6 has better thermal stability than β-SiAlON:Eu$^{2+}$ (Comparative Example 3), which is known for its excellent thermal characteristics.

Figure 13:
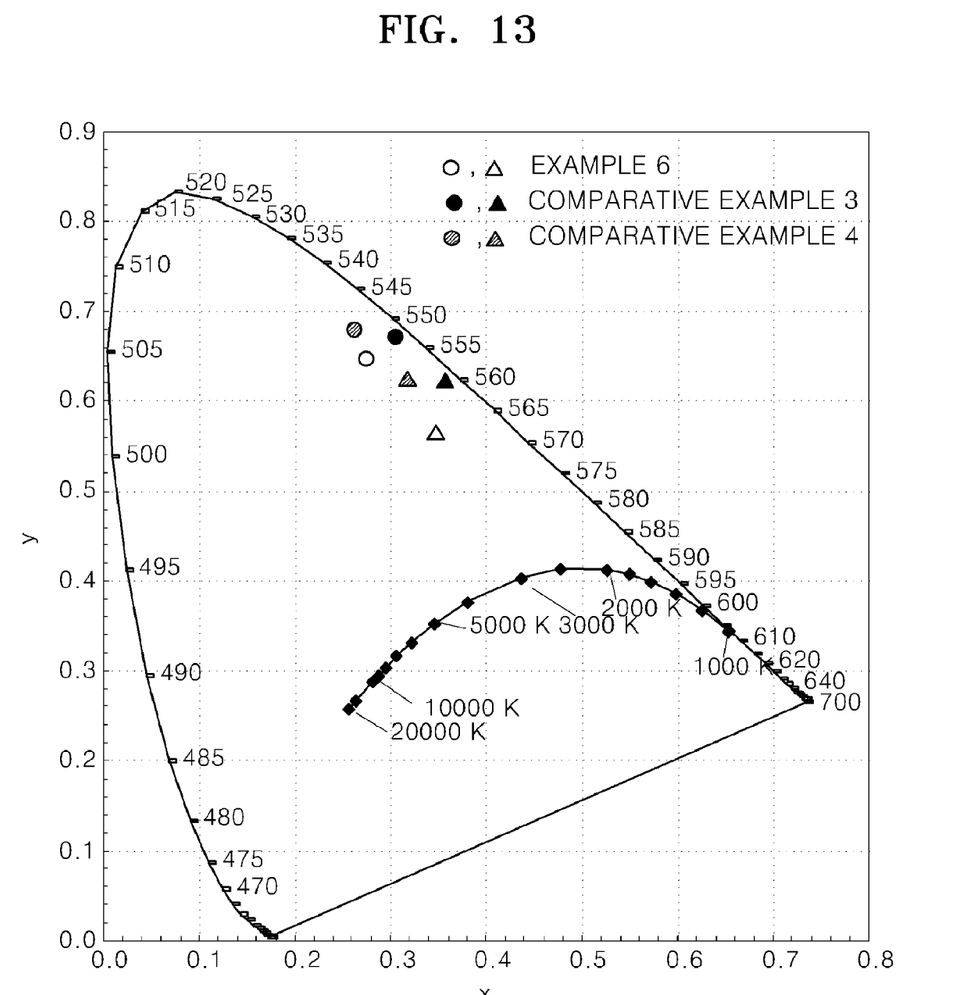
FIG. 13 shows a color coordinate plot of green phosphors prepared according to Example 6 and Comparative Examples 3 and 4 when they are used for a liquid crystal display ("LCD") backlight unit without (Δ) and with (○) a color.

FIG. 13 and Table 1 shows color coordinates (x, y) of the phosphors of Example 6, Comparative Example 3, and Comparative Example 4 when they are used for a LCD backlight unit without (Δ) and with (○) a color filter (see FIG. 13). Referring to FIG. 13 and Table 1, the color coordinate of the o-Ca$_3$SiO$_4$Cl$_2$:Eu$^{2+}$ phosphor (Example 6) is similar to color coordinates of (Sr,Ba)$_2$SiO$_4$:Eu$^{2+}$ (Comparative Example 4) and β-SiAlON:Eu$^{2+}$ (Comparative Example 3) which are typically used in liquid crystal display ("LCD") backlight unit, and thus it can be seen that the o-Ca$_3$SiO$_4$Cl$_2$:Eu$^{2+}$ phosphor of Example 6 is suitable for a LCD backlight.

TABLE 1

|  | Example 6 | Comparative Example 3 | Comparative Example 4 |
|---|---|---|---|
| Without a color filter |  |  |  |
| x | 0.3468 | 0.3568 | 0.3176 |
| y | 0.5647 | 0.6232 | 0.6248 |
| with a color filter |  |  |  |
| x | 0.2740 | 0.3051 | 0.2621 |
| y | 0.6472 | 0.6715 | 0.6789 |

Figure 14:
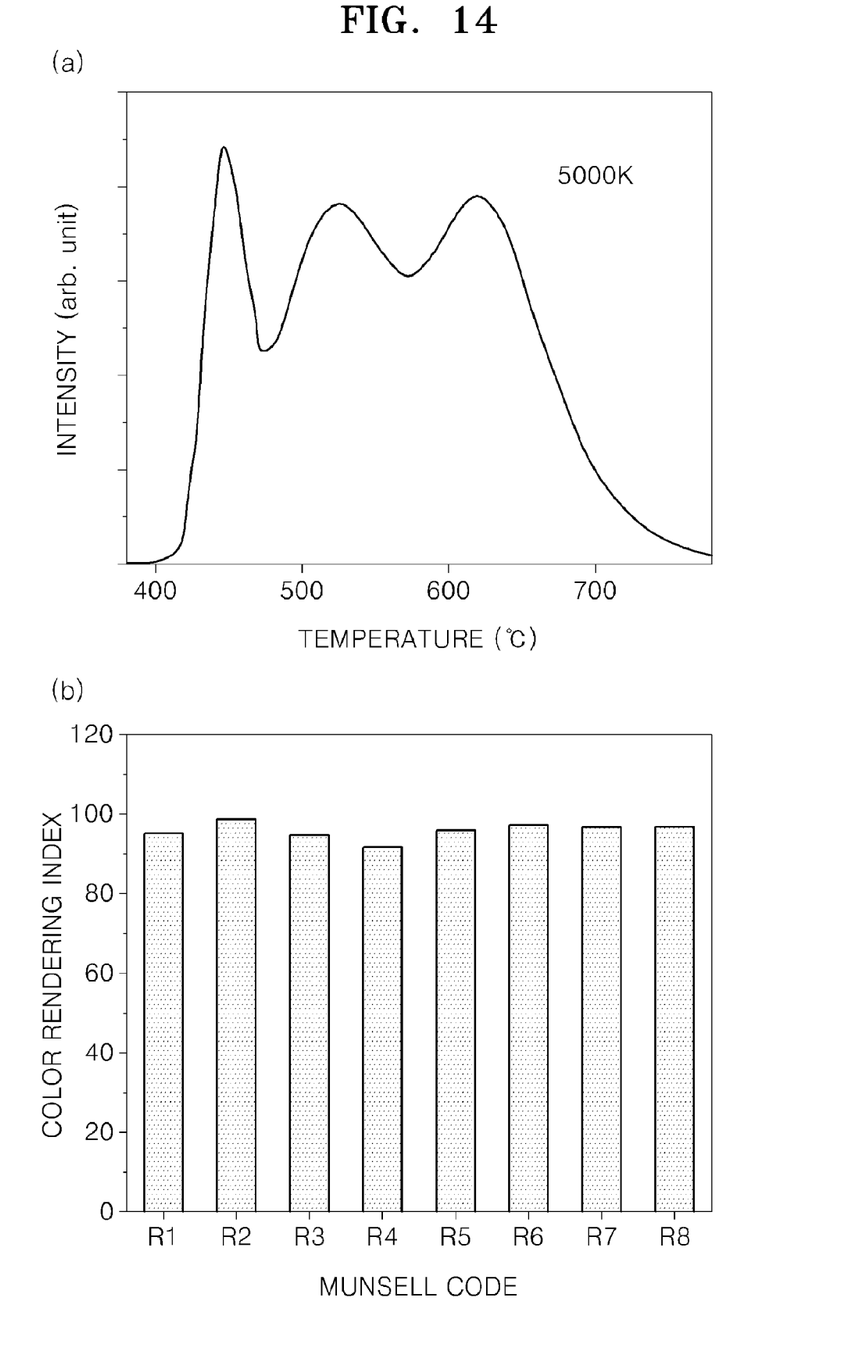
FIGS. 14a and 14b respectively show a spectrum and a color rendering index of white light having a color temperature of 5000 K in a white light-emitting device manufactured according to Example 6.
Figure 15:
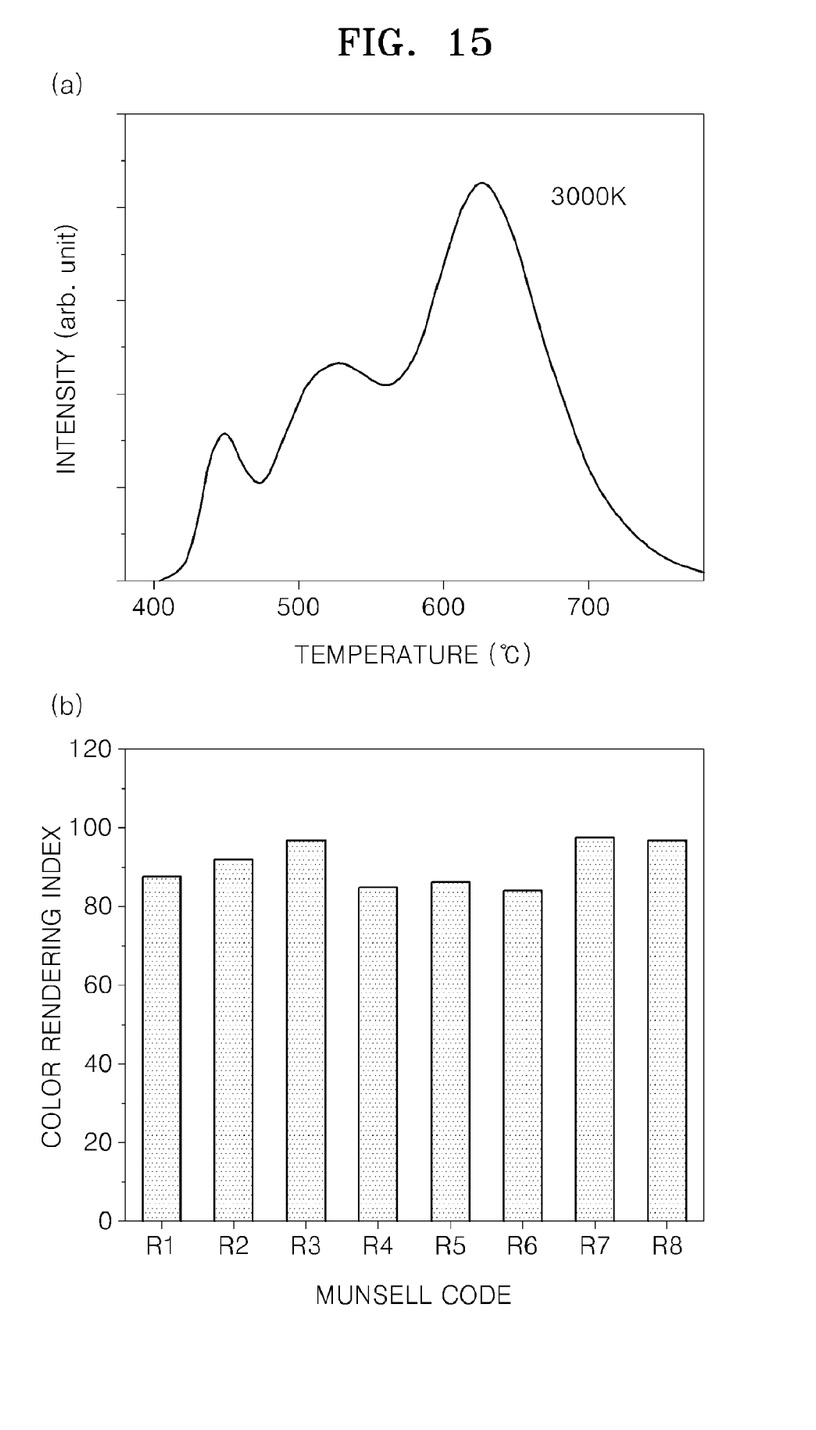
FIGS. 15a and 15b respectively show a spectrum and a color rendering index of white light having a color temperature of 3000 K in a white light-emitting device manufactured according to Example 6.

FIGS. 14 and 15 each show a luminescence spectrum (a) as a plot of intensity (arbitrary units) versus temperature (° C.) and a color rendering index (b) as a bar chart of color rendering index versus Munsell Code (R1-R8 for the red portion of the index) when the phosphor of Example 6 is used to produce white light for illuminations with a color temperature of 5000K and 3000K, respectively. The phosphor of Example 6 has a relatively wide half-width and thus in respect to display purposes, shows a lower color purity than the phosphors of Comparative Example 3 and Comparative Example 4. However, the phosphor of Example 6 is suitable for illumination because it has a color rendering index of 90 or more even for a warm white having a color temperature of 3000 K. Regarding cool white with a color temperature of 5000 K, white light that is similar to natural light having a color rendering index of 95.7 may also be generated.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A green phosphor represented by Formula 1 below, wherein in an X-ray diffraction pattern obtained by diffracting the green phosphor with Kα1 of Cu, a first intensity peak is positioned at a diffraction angle (2θ) of 30.5±1.0 and second through sixth intensity peaks are positioned at diffraction angles 24.8±1.0, 32.0±1.0, 35.0±1.0, 39.3±1.0 and 48.5±1.0 degrees, wherein the diffraction angle order does not match the second through sixth intensity peak order:

[Formula 1]

wherein

M$^1$ is at least one of metal selected from the group consisting of magnesium, calcium, strontium, barium, and any combination thereof, D is at least one of metal selected from the group consisting of europium, manganese, antimony, cerium, praseodymium, neodymium, samarium, terbium, dysprosium, erbium, ytterbium, bismuth, and any combination thereof, M$^2$ is at least one selected from the group consisting of silicon, germanium, aluminum, gallium, and any combination thereof, A is at least one selected from the group consisting of chlorine, fluorine, bromine, iodine, and any combination thereof, and 2.7≦p≦3.3, 0.7≦q≦1.3, 3.5≦r≦4.5, 1.7≦s≦2.3, and 0<x≦0.1.

2. The green phosphor of claim 1, wherein the green phosphor has an orthorhombic structure of a Pnma space group, wherein, the green phosphor has lattice constants a, b, and c wherein 10.5≦a≦12.2, 9.5b≦11, and 4.8≦c≦6.2 (unit: Å), and in a unit lattice, each of M$^1$ and D of Formula 1 is present at coordinates x, y, and z, respectively, of (0.33±0.1, 0.08±0.1, 0.36±0.1) and (0.04±0.1, 0.25±0.1, 0.62±0.1), M$^2$ is present at a coordinate x, y, and z, respectively, of (0.28±0.1, 0.25±0.1, 0.81±0.1), O is present at coordinates x, y, and z, respectively, of (0.33±0.1, 0.25±0.1, 0.08±0.1), (0.21±0.1, 0.12±0.1, 0.73±0.1), and (0.38±0.1, 0.25±0.1, 0.62±0.1), and A is present at a coordinate x, y, and z, respectively, of (0.07±0.1, 0.07±0.1, 0.25±0.1).

3. A method of preparing a green phosphor, the method comprising:

mixing an oxide of at least one of metal selected from the group consisting of Mg, Ca, Sr, Ba, and any combination thereof; an oxide of at least one of metal selected from the group consisting of Si, Ge, Al, Ga, and any combination thereof, and an oxide of at least one of metal selected from the group consisting of Eu Mn, Sb, Ce, Pr, Nd, Sm, Tb, Dy, Ho, Er, Yb, Bi, and any combination thereof;

heat treating the mixture at a temperature of about 900 to about 150° C. in air;

mixing the heat treatment product and a halogenated material of Ca, Sr, Ba, or a combination comprising at least one of the foregoing;

sintering the resultant mixture under a reducing atmosphere at a temperature of about 1,080 to about 1,200° C.; and grinding the sintering product.

4. A light-emitting device comprising:
a light-emitting diode (LED); and
the green phosphor of claim 1.

5. The light-emitting device of claim 4, wherein the light-emitting diode is a blue or ultraviolet (UV) LED.

6. The light-emitting device of claim 4, further comprising at least one of phosphor selected from the group consisting of a blue phosphor, a red phosphor, and any combination thereof.

7. The light-emitting device of claim 6, wherein the blue phosphor comprises at least one phosphor selected from the group consisting of (Sr,Ba,Ca)$_5$(PO$_4$)$_3$Cl:Eu$^{2+}$; BaMg$_2$Al$_{16}$O$_{27}$:Eu$^{2+}$; Sr$_4$Al$_{14}$O$_{25}$:Eu$^{2+}$; BaAl$_8$O$_{13}$:Eu$^{2+}$; BaMgAl$_{10}$O$_{17}$:Eu$^{2+}$ and Sr$_2$Si$_3$O$_8$(2SrCl$_2$):Eu$^{2+}$; Ba$_3$MgSi$_2$O$_8$:Eu$^{2+}$; (Sr,Ca)$_{10}$(PO$_4$)$_6$(nB$_2$O$_3$):Eu$^{2+}$, and any combination thereof.

8. The light-emitting device of claim 6, wherein the red phosphor comprises at least one phosphor selected from the group consisting of (Ba,Sr,Ca)$_2$Si$_5$N$_8$:Eu$^{2+}$; (Sr,Ca)AlSiN$_3$:Eu$^{2+}$; Y$_2$O$_3$:Eu$^{3+}$,Bi$^{3+}$; (Ca,Sr)S:Eu$^{2+}$; CaLa$_2$S$_4$:Ce$^{3+}$; (Sr,Ca,Ba)$_2$P$_2$O$_7$:Eu$^{2+}$,Mn$^{2+}$; (Ca,Sr)$_{10}$(PO$_4$)$_6$(F,Cl):Eu$^{2+}$,Mn$^{2+}$; (Y,Lu)$_2$WO$_6$:Eu$^{3+}$,Mo$^{6+}$; (Gd,Y,Lu,La)$_2$O$_3$:Eu$^{3+}$,Bi$^{3+}$; (Gd,Y,Lu,La)$_2$O$_2$S:Eu$^{3+}$,Bi$^{3+}$; (Gd,Y,Lu,La)BO$_3$:Eu$^{3+}$,Bi$^{3+}$; (Gd,Y,Lu,La)(P,V)O$_4$:Eu$^{3+}$,Bi$^{3+}$; (Ba,Sr,Ca)MgP$_2$O$_7$:Eu$^{2+}$,Mn$^{2+}$, and any combination thereof.

9. The light-emitting device of claim 4, wherein in a luminescence spectrum of the green phosphor, a peak wavelength is in a range of about 490 nm to about 560 nm.

10. The light-emitting device of claim 4, wherein the light-emitting device is used for a traffic light, a light source of a communication device, a backlight of a display device, or illumination.

11. A white light emitting device, comprising:
an ultraviolet or blue light-emitting diode (LED); and
a combination of
  a red phosphor,
  a green phosphor represented by Formula 1 below, and optionally, a blue phosphor,
  wherein in an X-ray diffraction pattern obtained by diffracting the green phosphor with Kα1 of Cu, a first intensity peak is positioned at a diffraction angle (2θ) of 30.5±1.0 and second through sixth intensity peaks are positioned at diffraction angles 24.8±1.0, 32.0±1.0, 35.0±1.0, 39.3±1.0 and 48.5±1.0 degrees, wherein the diffraction angle order does not match the second through sixth intensity peak order:

$$(M^1_{1-x}D_x)_p M^2_q O_r A_s$$ [Formula 1]

wherein
  $M^1$ is at least one of metal selected from the group consisting of magnesium, calcium, strontium, barium, and any combination thereof,
  D is at least one of metal selected from the group consisting of europium, manganese, antimony, cerium, praseodymium, neodymium, samarium, terbium, dysprosium, erbium, ytterbium, bismuth, and any combination thereof,
  $M^2$ is at least one selected from the group consisting of silicon, germanium, aluminum, gallium, and any combination thereof,
  A is at least one selected from the group consisting of chlorine, fluorine, bromine, iodine, and any combination thereof,
  and $2.7 \leq p \leq 3.3$, $0.7 \leq q \leq 1.3$, $3.5 \leq r \leq 4.5$, $1.7 \leq s \leq 2.3$, and $0 < x \leq 0.1$.

12. The white light-emitting device of claim 11, wherein the blue phosphor comprises at least one phosphor selected from the group consisting of $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $BaMgAl_{10}O_{17}:Eu^{2+}$ and $Sr_2Si_3O_8(2SrCl_2):Eu^{2+}$; $Ba_3MgSi_2O_8:Eu^{2+}$; $(Sr,Ca)_{10}(PO_4)_6(nB_2O_3):Eu^{2+}$, and any combination thereof.

13. The white light-emitting device of claim 6, wherein the red phosphor comprises at least one phosphor selected from the group consisting of $(Ba,Sr,Ca)_2Si_5N_8:Eu^{2+}$; $(Sr,Ca)AlSiN_3:Eu^{2+}$; $Y_2O_3:Eu^{3+},Bi^{3+}$; $(Ca,Sr)S:Eu^{2+}$; $CaLa_2S_4:Ce^{3+}$; $(Sr,Ca,Ba)_2P_2O_7:Eu^{2+},Mn^{2+}$; $(Ca,Sr)_{10}(PO_4)_6(F,Cl):Eu^{2+},Mn^{2+}$; $(Y,Lu)_2WO_6:Eu^{3+},Mo^{6+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)BO_3:Eu^{3+},Bi^{3+}$; $(Gd,Y,Lu,La)(P,V)O_4:Eu^{3+},Bi^{3+}$; $(Ba,Sr,Ca)MgP_2O_7:Eu^{2+},Mn^{2+}$, and any combination thereof.

14. The white light-emitting device of claim 11, wherein in a luminescence spectrum of the green phosphor, a peak wavelength is in a range of about 490 nm to about 560 nm.

* * * * *